United States Patent
Jung et al.

(10) Patent No.: US 7,132,826 B1
(45) Date of Patent: Nov. 7, 2006

(54) CHARACTERIZATION OF RECEIVER DEMODULATION FOR CORRECTING OFF-AXIS MR IMAGING DEGRADATION

(75) Inventors: Youngkyoo Jung, Madison, WI (US); Yogesh A. Jashnani, Madison, WI (US); Walter F. Block, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/289,960

(22) Filed: Nov. 30, 2005

(51) Int. Cl.
*G01V 3/00* (2006.01)
(52) U.S. Cl. ....................... 324/307; 324/309
(58) Field of Classification Search ............... 324/307, 324/309, 312, 314, 318, 322
See application file for complete search history.

(56) References Cited

U.S. PATENT DOCUMENTS

| | | | |
|---|---|---|---|
| 5,172,059 A | 12/1992 | den Boef | |
| 5,289,127 A | 2/1994 | Doddrell et al. | |
| 5,594,341 A | 1/1997 | Maiidi-Ahv et al. | |
| 5,689,186 A | 11/1997 | Maier et al. | |
| 5,770,943 A * | 6/1998 | Zhou | 324/307 |
| 5,856,744 A | 1/1999 | Block et al. | |
| 6,160,397 A * | 12/2000 | Washburn et al. | 324/309 |
| 6,160,400 A | 12/2000 | Friedrich et al. | |
| 6,215,306 B1 | 4/2001 | Tsai et al. | |
| 6,271,666 B1 | 8/2001 | Linz et al. | |
| 6,288,545 B1 * | 9/2001 | King et al. | 324/318 |
| 6,297,637 B1 | 10/2001 | Feld et al. | |
| 6,313,629 B1 * | 11/2001 | Liu et al. | 324/309 |
| 6,522,139 B1 * | 2/2003 | Thompson et al. | 324/307 |
| 6,621,433 B1 | 9/2003 | Hertz | |
| 6,668,184 B1 | 12/2003 | Kleiman | |
| 6,680,610 B1 | 1/2004 | Kyriakos et al. | |
| 6,794,867 B1 | 9/2004 | Block et al. | |
| 6,943,548 B1 | 9/2005 | Hertz | |

OTHER PUBLICATIONS

P. Speier, F. Trautwein; A Calibration For Radial Imaging With Large Inplane Shifts; Proc. Intl. Soc. Mag. Reson. Med. 13 (2005); p. 2295.

Jeff H. Duyn et al; Simple Correction Method for K-space Trajectory Deviations In MRI; Journal of Mag. Reson. 132, 150-153 (1998).

* cited by examiner

*Primary Examiner*—Louis M. Arana
(74) *Attorney, Agent, or Firm*—Quarles & Brady LLP

(57) ABSTRACT

A calibration procedure is performed prior to an off-axis MR scan to measure the MRI system timing error in applying a frequency modulation waveform to the system receiver. Phase errors which otherwise occur when performing non-Cartesian scans are either prospectively reduced by offsetting the timing error or retrospectively offset by applying phase corrections to the acquired image data.

6 Claims, 5 Drawing Sheets

CHARACTERIZATION OF RECEIVER DEMODULATION FOR CORRECTING OFF-AXIS MR IMAGING DEGRADATION

BACKGROUND OF THE INVENTION

The field of the invention is nuclear magnetic resonance imaging methods and systems.

When a substance such as human tissue is subjected to a uniform magnetic field (polarizing field $B_0$), the individual magnetic moments, commonly called spins, in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment Mt. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

A number of imaging techniques use the spin warp method, sometimes referred to as the Fourier transform (FT) method, in which one or two magnetic field gradients phase encode spatial information in the direction of the gradient. In a two-dimensional implementation (2DFT), for example, spatial information is encoded in one direction by applying a phase encoding gradient along one gradient direction, and then a gradient echo or a spin-echo signal is acquired in the presence of a readout magnetic gradient in a direction orthogonal to the phase encoding gradient. The readout gradient present during the signal acquisition encodes spatial information in the orthogonal direction. In a typical 2DFT scan, the magnitude of the phase encoding gradient pulse is incremented in the sequence of views that are acquired and Fourier space, or "k-space" is sampled in a Cartesian grid. Most scans currently performed on MRI systems employ such 2DFT or 3DFT techniques.

There are a number of MR imaging techniques which do not use the Fourier transform method of sampling k-space in a Cartesian grid. These include spiral techniques such as that described in U.S. Pat. Nos. 6,215,305 and 6,404,194; projection reconstruction, or radial, techniques such as that described in U.S. Pat. No. 6,794,867; and shell k-space sampling techniques such as that described in U.S. Pat. No. 5,532,595. A common element of these non-Cartesian sampling techniques is that the imaging gradient field changes strength and is time-varying during the read-out of the NMR signal.

Non-Cartesian imaging techniques have several benefits in accelerating magnetic resonance imaging. However, these techniques are more sensitive to system instabilities caused by eddy currents and hardware delays that vary from MRI system to system. While forms of these faster imaging methods are available on clinical platforms, they are generally considered to create artifacts not seen in conventional Cartesian imaging. However, they are used heavily because their speed allows them to capture physiological processes not possible with Cartesian imaging.

One clinical application that is particularly problematic for non-Cartesian imaging techniques is off axis imaging. Imaging off axis or off isocenter in MRI is often necessary because the anatomy of interest cannot be placed at the center of the magnet. Common situations include the knee, shoulder, and heart. Off axis imaging using a Cartesian pulse sequence is easily managed by introducing a constant frequency shift, or equivalent linear phase shift in the received NMR signal which effectively shifts the center of the reconstructed image away from the system isocenter. This is commonly done by modifying the phase of the reference signal used to demodulate the received NMR signals. In Cartesian imaging, this is done by offsetting the frequency of the reference signal for imaging offsets along the readout gradient direction or creating a linear shifting of the phase of the acquired k-space data in the phase-encoding gradient direction. In the readout direction, the required phase shifts are linearly proportional to the image offset along the readout gradient axis and the strength of the readout gradient. When non-Cartesian pulse sequences are used, however, this strategy becomes much more difficult because the time-varying gradients can be considered to be changing the direction and the strength of the readout gradient. The phase shift is no longer simply linear and must be changed in real time as the changing gradient waveforms are played out during the NMR signal acquisition.

SUMMARY OF THE INVENTION

The present invention stems from the recognition that many of the image artifacts produced by non-Cartesian imaging techniques when performing off axis imaging is due to phase errors introduced by the real-time demodulation hardware within the MRI system. The phase errors can be attributed to a timing delay between the real-time demodulation hardware and the generation of the gradient fields. The timing delay varies from scanner to scanner. In the present invention, a calibration procedure is performed during a pre-scan to measure the timing delay that in turn causes the phase errors. Correction can be made prospectively during the subsequent scan by offsetting the timing error during data acquisition, or it can be made retrospectively by phase correcting the acquired data.

DESCRIPTION OF THE PREFERRED EMBODIMENT

Figure 1:
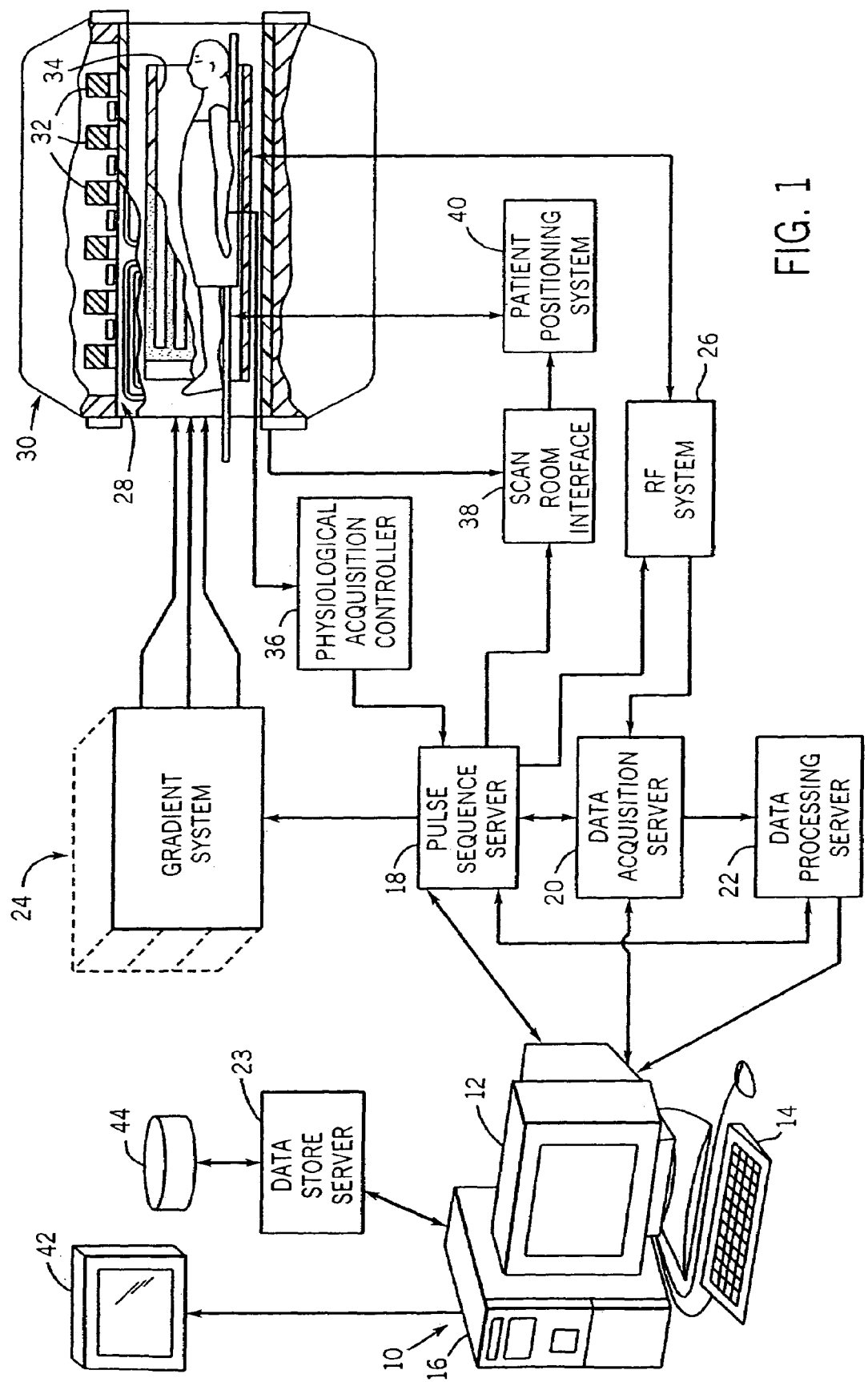
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$, and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Typically, the MRI system will have from 1 to 8 receive channels which may be connected to a corresponding plurality of local coils or to a corresponding plurality of coil elements in a coil array. Each RF receive channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\phi+=\tan^{-1}Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed, by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
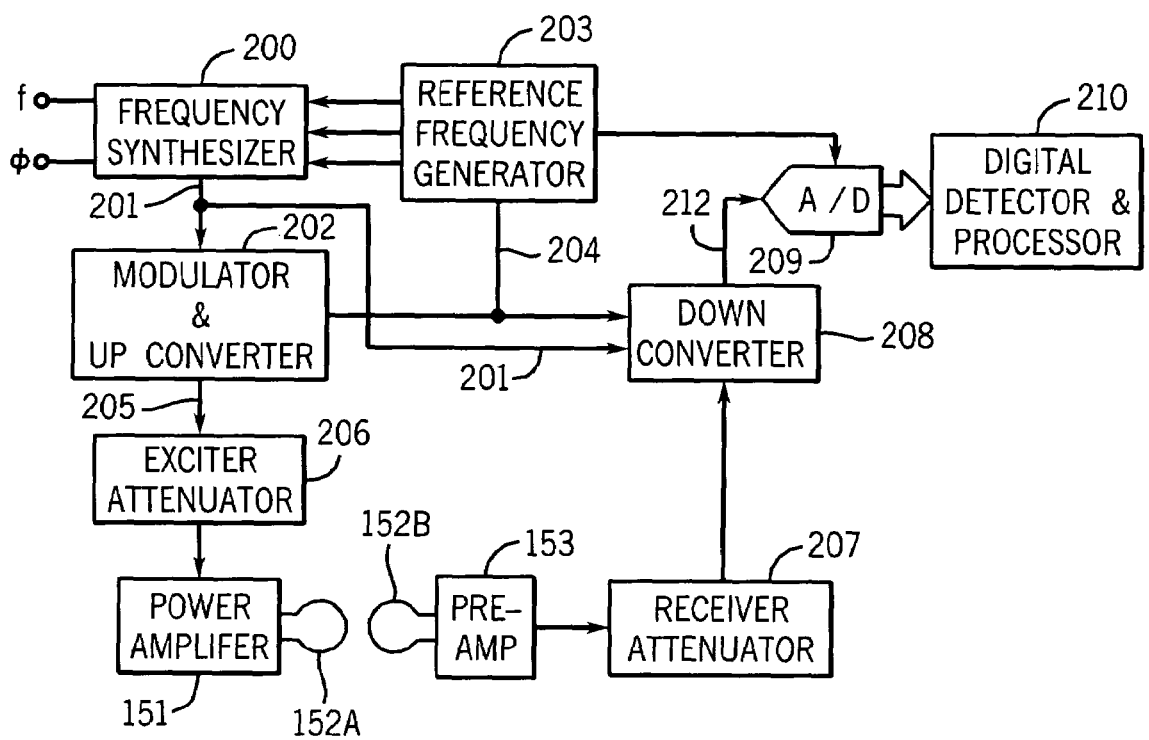
FIG. 2 is a block diagram of the RF system which forms part of the MRI system of FIG. 1.

As shown in FIG. 1, the RF system 26 may be connected to the whole body rf coil 34, or as shown in FIG. 2, a transmitter section of the RF system 26 may connect to one rf coil 152A and its receiver section may connect to a separate rf receive coil 152B. Often, the transmitter section is connected to the whole body rf coil 34 and each receiver section is connected to a separate local coil 152B.

Referring particularly to FIG. 2, the RF system 26 includes a transmitter that produces a prescribed rf excitation field. The base, or carrier, frequency of this RF excitation field is produced under control of a frequency synthesizer 200 which receives a set of digital signals from the pulse sequence server 18. These digital signals indicate the frequency (f) and phase (θ) of the RF carrier signal produced at an output 201. The RF carrier is applied to a modulator and up converter 202 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may be changed to enable a wide variety of desired RF pulse envelopes to be produced.

The magnitude of the RF excitation pulse produced at output 205 is attenuated by an exciter attenuator circuit 206 which receives a digital command from the pulse sequence server 18. The attenuated RF excitation pulses are applied to the power amplifier 151 that drives the RF coil 152A. For a more detailed description of this transmitter section reference is made to U.S. Pat. No. 4,952,877 which is incorporated herein by reference.

Referring still to FIG. 2 the signal produced by the subject is picked up by the receiver coil 152B and applied through a preamplifier 153 to the input of a receiver attenuator 207. The receiver attenuator 207 further amplifies the signal by an amount determined by a digital attenuation signal received from the pulse sequence server 18. The received signal is at or around the Larmor frequency, and this high frequency signal is down converted in a two step process by a down converter 208 which first mixes the NMR signal with the carrier signal on line 201 and then mixes the resulting difference signal with a reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 209 are produced by a reference frequency generator 203. For a more detailed description of the receiver, reference is made to U.S. Pat. No. 4,992,736 which is incorporated herein by reference.

To produce an image which is offset from the MRI system isocenter the frequency of the reference signal on line 201 is shifted by an amount Δf which is determined by the magnitude of imaging gradients being applied as the NMR signal is acquired. This is described in U.S. Pat. No. 5,689,186 entitled "Method For Producing An Off-Center Image Using An EPI Pulse Sequence":

$$\Delta f = -\gamma(G_x d_x + G_y d_y) \quad (1)$$

where
  γ=gyromagnetic ratio for spins;
  $G_x$=gradient along x-axis;
  $d_x$=offset of FOV along x-axis;
  $G_y$=gradient along y-axis; and
  $d_y$=offset of FOV along y-axis.

In non-Cartesian acquisitions one or more of the gradients changes in amplitude during the NMR signal acquisition and as a result, this frequency shift Δf changes as a function of time Δf(t) as the gradient waveforms $G_x(t)$ and $G_y(t)$ are played out by the pulse sequence server 18. This frequency shift function is applied to the frequency synthesizer 200 by the pulse sequence server 18 and the frequency shift Δf(t) is applied to the down converter 208 which demodulates the acquired NMR signal.

It is a discovery of the present invention that even small timing discrepancies between the application of this frequency shift Δf(t) to the down converter 208 and the playout of the gradient fields $G_x(t)$ and $G_y(t)$ in the bore of the magnet will produce substantial phase errors ($E_{\theta FreqDemod}$) in the acquired NMR data. The present invention is a method for measuring this timing error which can be done as part of a prescan procedure for each patient and a method of compensating, or correcting the subsequently acquired NMR data.

Figure 3:
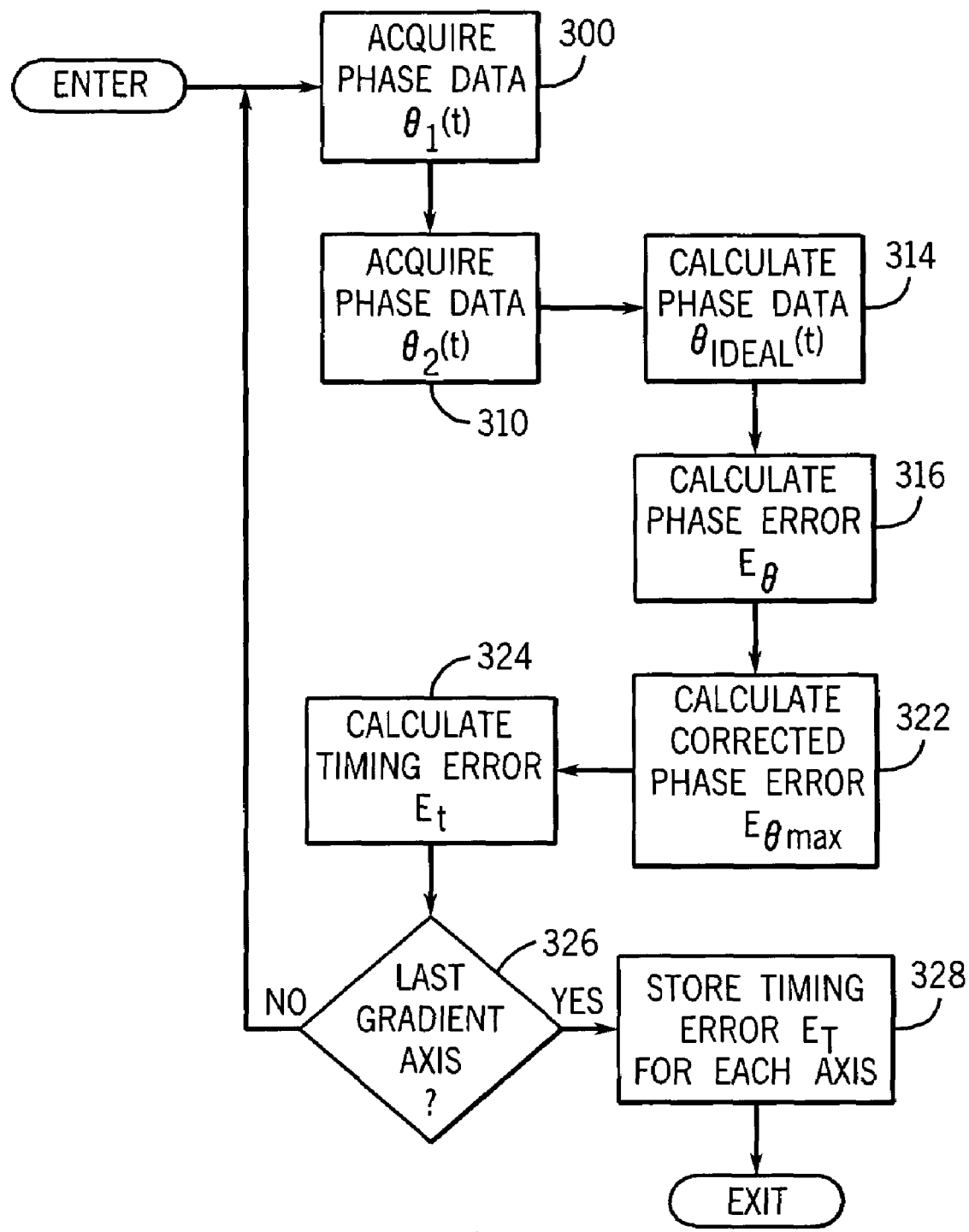
FIG. 3 is a flow chart of a calibration procedure which is part of a prescan process employed by the MRI system of FIG. 1.
Figure 4:
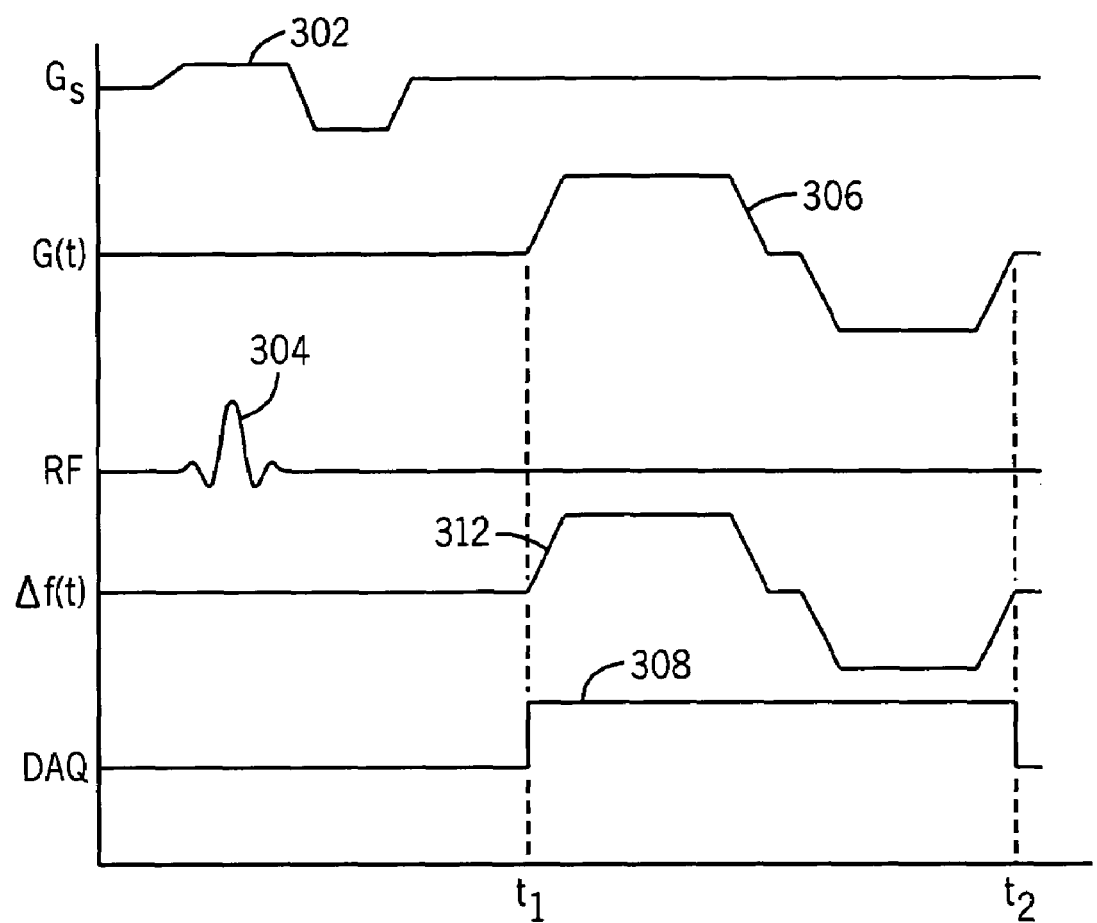
FIG. 4 is a graphic representation of a pulse sequence performed by the MRI system when performing the calibration method of FIG. 3.

When an off-axis image is to be acquired the scan prescription will include one or more scan parameters that indicate the offset distance from the system isocenter along one or more gradient axes $G_x$, $G_y$, $G_z$. A prescan process illustrated in FIG. 3 is used to calculate a timing error in the frequency synthesizer 201. The first step in the calibration process as indicated by process block 300 is to acquire calibration data $\theta_1(t)$ from a slice that is located a distance D from the system isocenter along one gradient axis. The pulse sequence used is illustrated in FIG. 4 and includes a slice-select gradient waveform 302 applied with a selective 90° RF excitation pulse 304 to excite spins in the slice. A bipolar gradient waveform 306 directed along the gradient axis is applied a short time thereafter, and an NMR signal is acquired simultaneously as indicated by acquisition window 308. The phase of the acquired k-space samples are calculated as described above and stored. The pulse sequence can be repeated a number of times (e.g., 20) and averaged to increase the SNR of the measurement. The phase of the measurement serves as the calibration data set $\theta_1(t)$.

The next step indicated at process block 310 in FIG. 3 is to acquire a second set of calibration phase data $\theta_2(t)$. This employs the same pulse sequence shown in FIG. 4, but this time a frequency modulation Δf(t) is applied to the receiver as described above to offset the slice a distance D along the gradient axis being calibrated. As shown in FIG. 4 the frequency modulation Δf(t) is a bipolar waveform 312 that is shaped like the gradient waveform G(t) and is intended to produce the offset D as indicated above in Equation (1). The pulse sequence is repeated and the phase of the k-space samples acquired during the window 308 are averaged to produce calibration data set $\theta_2(t)$.

The next step as indicated by process block 314 is to calculate the phase of the acquired NMR signal samples based on the prescribed gradient waveform G(t). This is done as follows:

$$\Delta_{IDEAL}(t) = \int_{T_1}^{T_2} \gamma D G(t) dt \qquad (2)$$

where γ is the gyromagnetic ratio, D is the distance from the isocenter and the interval $t_1$ to $t_2$ is the time period during which the gradient waveform is played out and the NMR signal is acquired as shown in FIG. 4. This is the theoretical, or ideal, phase that the acquired NMR signal from the test slice should have if there were no phase errors of any kind in the MRI system.

As indicated at process block 316, a phase error $E_\theta(t)$ is now calculated from the phase values $\theta_1(t)$, $\theta_2(t)$ and $\theta_{IDEAL}(t)$. The phase values $\theta_1(t)$ are measurements which include the ideal phase shifts $\theta_{IDEAL}(t)$ plus phase errors due to $B_0$ field inhomogeneities $E_B$ and phase errors $E_{GRAD}$ due to such factors as gradient-induced eddy currents and concomitant gradients:

$$\theta_1(t) = \theta_{IDEAL}(t) + E_B + E_{GRAD}. \qquad (3)$$

The phase values $\theta_2(t)$ are measurements which include three phase error components: $E_B$; $E_{GRAD}$; and a phase error component $E_{\Delta f}$ caused by an inaccurate application of the frequency modulation waveform $\Delta f(t)$ to the receiver:

$$\theta_2(t) = E_B + E_{GRAD} + E_{\Delta f} \qquad (4)$$

The phase error $E_{\Delta f}$ is calculated by combining equations 3 and 4 as follows:

$$E_{\Delta f}(t) = \theta_2(t) - [\theta_1(t) - \theta_{IDEAL}(t)]. \qquad (5)$$

Figure 5:
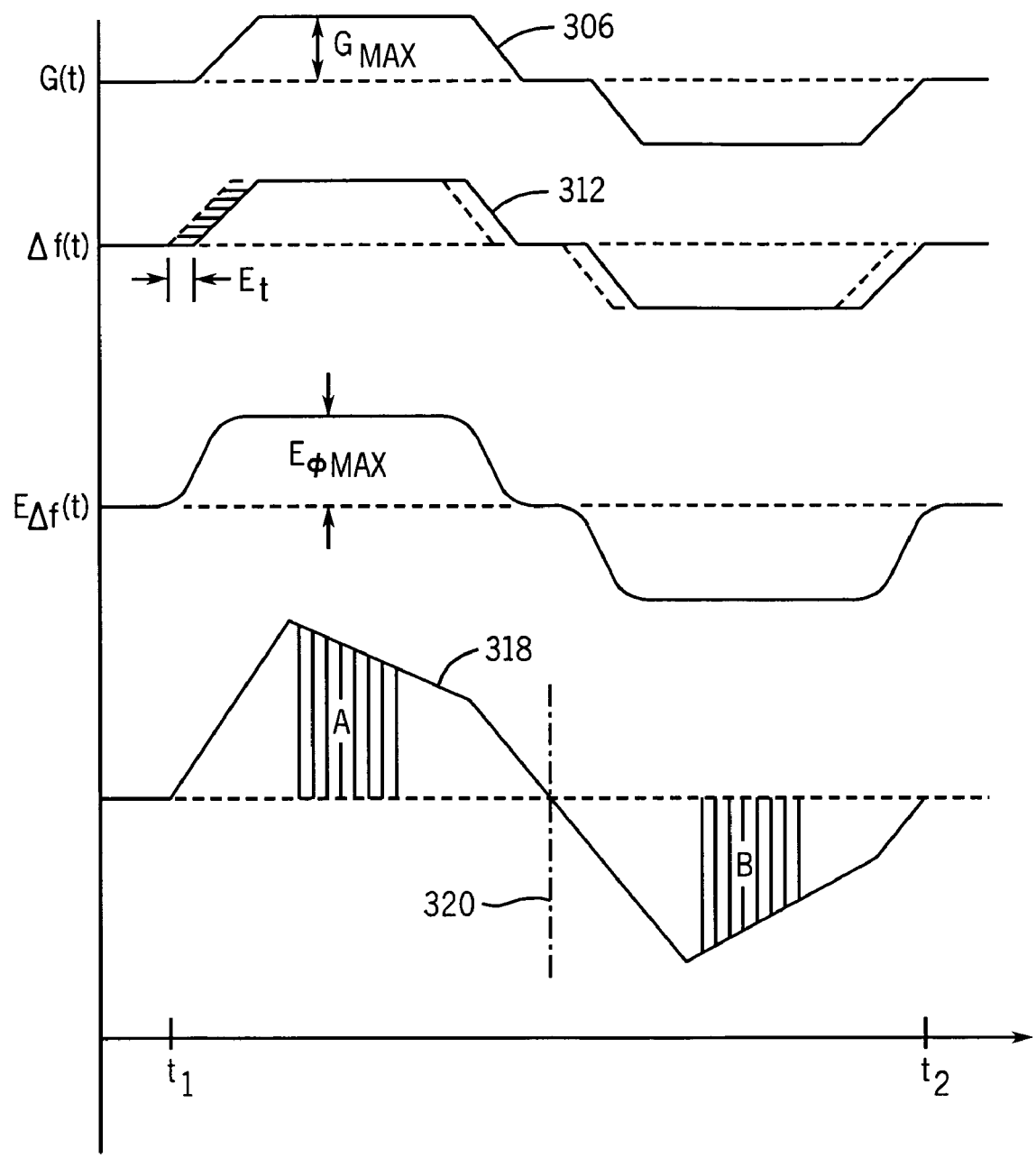
FIG. 5 is a graphic representation of waveforms produced while practicing the calibration method of FIG. 3.

The phase error $E_{\Delta f}(t)$ is shown in FIG. 5, for example, where there is a timing error $E_t$ between the application of the gradient waveform 306 to the subject being imaged and the application of the $\Delta f(t)$ frequency modulation waveform 312 to the receiver. However, it has been discovered that in most measurements an additional phase error is introduced due to misclaibrations of the gradient amplifier strength cause a slightly inaccurate slice location in the calibration pulse sequence of FIG. 4. The miscalibration causes slightly more or slightly less phase accumulation over the test slice during the bipolar gradient waveform. The phase error looks similar to the k-space trajectory of the bipolar gradient waveform and has the appearance of a half cycle of a sine wave. While these miscalibrations are insignificant in clinical imaging, they add a bias that alters the phase error signal so that it usually looks like the waveform 318. To eliminate this additional phase error and calculate the maximum phase error $E_{\theta max}$ due solely to mistiming $E_t$, the average value in two regions A and B which are symmetrically disposed to either side of an axis 320 are employed. As indicated at process block 322, maximum phase error $E_{\theta max}$ is then calculated according to the following equation:

$$E_{\phi max} = \frac{Average(A) - Average(B)}{2}. \qquad (6)$$

The maximum phase error $E_{\theta max}$ is related to the timing error $E_t$ by the following expression:

$$E_{\theta max} = 2\pi \gamma G_{max} D E_t \qquad (7)$$

As indicated at process block 324, equation (7) can then be solved for the timing error $E_t$ as follows:

$$E_t = E_{\theta max} / 2\pi \gamma D G_{max}. \qquad (8)$$

The timing error between applied gradient fields and the applied $\Delta f(t)$ frequency modulation waveform may thus be calculated with a high degree of accuracy.

Referring again to FIG. 3, the timing error $E_t$ may be substantially the same for all gradient axes, however, in the preferred embodiment the process is repeated for each separate imaging gradient. When the timing error has been measured for each gradient axes as determined at decision block 326 the timing errors are stored as indicated at process block 328 and the calibration process is exited.

The correction for the calculated timing error $E_t$ can be made in two ways. First, a prospective correction can be made during the image scan that follows the prescan process described above. Prospective correction is accomplished by shifting the timing of the frequency modulation waveform $\Delta f(t)$ by an amount $E_t$. Referring to FIGS. 2 and 5, this delays the application of the waveform $\Delta f(t)$ to the receiver such that it precisely aligns with the gradient waveform $G(t)$ applied during the scan. As a result, the phase error $E_{\theta max}$ is not produced during the subsequent acquisition of the image data during the scan. While in theory this prospective correction can be made with great precision, in practice this correction may have limited precision because the waveforms that create $\Delta f(t)$ are sampled digitally and must begin and end at quantized intervals on the MRI system.

Another prospective correction method may also be used. In this case the correction is made by using a real-time phase demodulation instead of or in addition to the frequency demodulation. However, since the phase demodulation signal can change amplitude at each time point, this can require significantly more waveform memory than real-time frequency demodulation. As the phase modulation waveform will often change for each repetition time in a non-Cartesian pulse sequence, alternatively reloading the waveform memory between repetition times is time-consuming and is difficult to implement.

The timing error correction can also be made retrospectively to the image data after it has been acquired. While this increases the image reconstruction time, the retrospective correction is not limited in accuracy by MRI system constraints that may prevent accurate prospective correction.

The receiver demodulator assumes that the frequency modulation waveform $\Delta f(t)$ does not have any distortion, but only a timing error during its operation. We can estimate the experimentally applied phase information from the frequency demodulation at each data acquisition time from the ideal gradient waveform.

$$\Phi_{experimental}(t) = 2\pi \int_{-\infty}^{t} \Delta f(t+\tau) dt = 2\pi \int_{-\infty}^{t} \gamma(G_x(t+\tau)d_x + G_y(t+\tau)d_y) dt \qquad (9)$$

where $\Phi_{experimental}(t)$ is the experimentally applied phase from the frequency demodulation, $d_x$ and $d_y$ are offset distances in the x and y-axis in the units of cm, respectively.

The k-space position based on gradients x and y can be expressed in Eq. (10)

$$k_x(t) = \gamma \int_{-\infty}^{t} G_x(t) dt, k_y(t) = \gamma \int_{-\infty}^{t} G_y(t) dt \qquad (10)$$

Hence $$\Phi_{experimental}(t) = 2\pi[(k_x(t+\tau)d_x + (k_y(t+\tau)d_y] \qquad (11)$$

where $\Phi_{experimental}(t)$ represents the phase that was demodulated in real time at the receiver. The actual phase $\Phi_{desired}(t)$ which should have been demodulated is given by $$\Phi_{desired}(t)=2\pi\int_{-\infty}^{t}\Delta f(t)=2\pi\int_{-\infty}^{t}(G_{xactual}(t)d_x+G_{yactual}(t)d_y)dt \quad (12)$$

$\Phi_{desired}(t)$ is calculated based on the actual gradient waveforms which are distorted from the ideal waveforms by eddy currents and system timing delay, which may differ between axes.

The actual gradient waveforms can be calculated by using a known gradient calibration method. This calibration method provides the correction of k-space trajectories based on actual gradient waveforms $G_{actual}(t)$, and the actual k-space locations can be expressed by Eq. (13).

$$k_{xactual}(t)=\gamma\int_{-\infty}^{t}G_{xactual}(t)dt, k_{yactual}(t)=\gamma\int_{-\infty}^{t}G_{yactual}(t)dt \quad (13)$$

While the real-time frequency demodulation timing error is the same on all axes, the errors due to gradient imperfections are different, and hence are compensated for each axis. The k-space positions thus obtained contain the effects of gradient errors and represent the actual gradient waveforms that were applied from the scanner.

Hence the phase which should have been modulated can be rewritten as, $$\Phi_{desired}(t)=2\pi[k_{xactual}(t)d_x+k_{yactual}(t)d_y]. \quad (14)$$

The difference $\Phi_{corr}(t)$, between the desired and the experimental phase $$\Phi_{corr}(t)=\Phi_{desired}(t)-\Phi_{experimental}(t) \quad (15)$$

is the amount of phase correction that has to be applied retrospectively to each raw data point in the reconstruction. The corrected raw data may also be gridded to the actual k-space positions obtained from a k-space deviation calibration method. Thus, both the phase and k-space location errors due to gradient imperfections may be retrospectively compensated. Note that $\Phi_{corr}(t)$ increases as the image is acquired further away from iso center. Phase correction is zero when imaging on iso center. Hence there is no need of phase compensation due to timing and gradient errors for on-axis or on-isocenter imaging.

The invention claimed is:

1. A method for calibrating a magnetic resonance imaging (MRI) system prior to the acquisition of an image that is offset from the system isocenter, the steps comprising:
    a) performing a pulse sequence with the MRI system which includes a gradient waveform G(t) that is applied while acquiring an NMR signal as a series of k-space samples;
    b) producing first calibration phase data $\theta_1(t)$ by calculating the phase of each k-space sample acquired in step a);
    c) performing the pulse sequence with the MRI system to acquire a second NMR signal as a series of k-space samples while applying a frequency modulation $\Delta f(t)$ to the MRI system receiver which offsets the location from which the NMR signal is acquired from the system isocenter;
    d) producing second calibration phase data $\theta_2(t)$ by calculating the phase of each k-space sample acquired in step c);
    e) calculating ideal phase data $\theta_{IDEAL}(t)$ from the gradient waveform G(t);
    f) calculating phase error $E_{\Delta f}(t)$ according to the following equation:

$$E_{\Delta f}(t)=\theta_2(t)-[\theta_1(t)-\theta_{IDEAL}(t)]; \text{ and}$$

g) calculating a timing error $E_t$ between the applied gradient waveform G(t) and the applied frequency modulation waveform $\Delta f(t)$ using the phase error $E_{\Delta f}(t)$ calculated in step f).

2. The method as recited in claim 1 in which step g) includes calculating from the phase error $E_{\Delta f}(t)$ a maximum phase error $E_{\Delta max}$.

3. The method as recited in claim 2 in which step g) further includes calculating the timing error according to the following expression:

$$E_t=E_{\theta max}/2\pi\gamma D\, G_{max}$$

where:
  $\gamma$=gyromagnetic constant,
  D=distance of the image from system isocenter,
  $G_{max}$=the maximum amplitude of the gradient G(t).

4. The method as recited in claim 1 which further includes using the timing error to prospectively correct image data subsequently acquired with the MRI system.

5. The method as recited in claim 1 which further includes retrospectively correcting image data subsequently acquired with the MRI system using the timing error.

6. The method as recited in claim 5 in which the image data is corrected by applying a phase shift thereto.

* * * * *